United States Patent [19]
Kasai et al.

[11] Patent Number: 6,160,394
[45] Date of Patent: Dec. 12, 2000

[54] BURN-IN BOARD

[75] Inventors: Keizo Kasai; Chikao Funai; Youzou Machida, all of Tokyo, Japan

[73] Assignee: Ando Electric Co., Ltd., Tokyo, Japan

[21] Appl. No.: 09/131,507

[22] Filed: Aug. 10, 1998

[30]     Foreign Application Priority Data

Sep. 22, 1997  [JP]  Japan .................................. 9-257138

[51] Int. Cl.⁷ .................................................. G01R 31/02
[52] U.S. Cl. ...................................... 324/158.1; 439/157
[58] Field of Search ................................ 324/158.1, 760, 324/765, 755; 439/79, 80, 571–573, 892–893

[56]              References Cited

U.S. PATENT DOCUMENTS

| | | | |
|---|---|---|---|
| 4,235,496 | 11/1980 | Aug et al. ................................. | 439/157 |
| 4,997,366 | 3/1991 | Hamilton et al. ........................ | 432/247 |
| 5,051,096 | 9/1991 | Cooke et al. ............................. | 439/61 |
| 5,286,207 | 2/1994 | McHugh ................................... | 439/64 |
| 5,492,479 | 2/1996 | Ortega ...................................... | 439/79 |
| 5,574,384 | 11/1996 | Ol ............................................ | 324/760 |

FOREIGN PATENT DOCUMENTS

| | | |
|---|---|---|
| 61-188997 | 8/1986 | Japan . |
| 4-2064 | 1/1992 | Japan . |
| 7-2981 | 1/1995 | Japan . |

*Primary Examiner*—Safet Metjahic
*Assistant Examiner*—Minh Tang
*Attorney, Agent, or Firm*—Pillsbury Madison & Sutro LLP

[57]              ABSTRACT

A burn-in board which has a flexure prevention structure for preventing the plate member from flexing surely, which can be easily mounted to and demounted from the plate member without screw nor adhesive. The burn-in board comprising: a plate member for loading a plurality of electronic devices to be tested thereon; and a flexure prevention structure for preventing the plate member from flexing, which comprises a plurality of rod-like supporting members for supporting approximately the entirety of rear surface of the plate member, the supporting members having an integrated structure so that a relationship between relative positions of the plurality of supporting members is substantially not changed by application of an ordinary external force.

7 Claims, 6 Drawing Sheets

BURN-IN BOARD

BACKGROUND OF THE INVENTION

1. Field of the Invention

The present invention relates to a burn-in board having a plate member mainly and a flexure prevention structure for preventing the plate member from flexing.

2. Description of Related Art

To devices such as IC packages or the like, a burn-in test is carried out in order to remove faulty devices. In the burn-in test, a burn-in board for loading a large number of devices to be tested thereon is used.

A burn-in board heretofore in use is shown in FIGS. 4A and 4B. The burn-in board shown in FIGS. 4A and 4B is one used for testing IC packages.

FIG. 4A is a perspective view showing the rear surface of a burn-in board 21 mainly. FIG. 4B is a vertical sectional view showing a state of a burn-in board 21 having a protective cover 26 attached to the rear surface thereof.

The burn-in board 21 comprises a flat plate 21a mainly on the front surface of which a large number of IC sockets 24, 24, . . . for putting on an IC packages (not shown) are arranged. On the front surface of the flat plate 21a, a circuit pattern through which a voltage is applied to the IC packages put on the IC sockets and an output signal is taken out of the IC packages corresponding to the applied voltage, is formed. An IC package is put on each of IC sockets 24, 24, by using an IC installation and removal device. The burn-in board 21 with the installed IC packages is disposed in a chamber for test.

The work for putting an IC package on each IC socket 24 by using the IC installation and removal device gives a large mechanical pressure to the IC package. Such a mechanical pressure or a vibration is transmitted to the flat plate 21a through the IC socket 24. Therefore, a flexure prevention structure is provided in the rear side of the flat plate 21a in order to prevent the board 21 from flexuring by such a mechanical pressure or the like. Concretely, a large number of square pillar-shaped supporting rods 22, 22, . . . are attached to the rear surface of the flat plate 21a to support it, as shown in FIG. 4. Because the supporting rods 22, 22, . . . would get out of position when a pressure or the like is applied to it, if the supporting rods 22, 22, were only set on the rear surface of the board 21, the supporting rods 22, 22, . . . are fixed to the rear surface of the burn-in board 21 by screwing each supporting rod or by using an adhesive.

However, the method for fixing the supporting rods 22, 22, . . . by screwing each supporting rod requires formation of screw holes for fitting male screws in the flat plate 21a, therein. Generally, almost the male screws for fitting in the screw holes are made of metal. Therefore, it is necessary for the circuit pattern formed on the front surface of the flat plate 21a to be designed to avoid the screw holes or to avoid male screws when male screws made of metal are used. As the result, design for patterning is restricted.

According to the method using an adhesive, it is difficult to select an appropriate adhesive because the burn-in test is often conducted under a strict temperature condition, that is, under a very high temperature or a very low temperature. There is also another problem that once the supporting rods are mounted to the board by using an adhesive it is hard to demount them.

Any one of the methods requires much time for a work for mounting or demounting a large number of used supporting rods 22 one by one, and therefore it is not possible to simplify the maintenance of the board.

SUMMARY OF THE INVENTION

The present invention was developed in view of these problems.

An object of the invention is to provide a burn-in board comprising a plate member such as the above-described flat plate, which has a flexure prevention structure for preventing the plate member from flexing surely, which can be easily mounted to and demounted from the plate member without screw nor adhesive.

In accordance with one aspect of the present invention, the burn-in board comprises; a plate member for loading a plurality of electronic devices to be tested thereon; and a flexure prevention structure for preventing the plate member from flexing, which comprises a plurality of rod-like supporting members for supporting approximately the entirety of rear surface of the plate member, the supporting members having an integrated structure so that a relationship between relative positions of the plurality of supporting members is substantially not changed by application of an ordinary external force.

According to the burn-in board, because the burn-in board comprises a plate member mainly on which devices to be tested can be loaded, and a flexure prevention structure for preventing the plate member from flexing by a plurality of rod-like supporting members supporting approximately the entirety of rear surface of the plate member, and the plurality of supporting members has an integrated structure, it does not require a work for mounting or demounting a large number of rod-like supporting rods one by one, and does require only a work for installation of the whole supporting members on the rear surface of the plate member as a body.

If each of the supporting members is easily moved relatively and the supporting members are merely installed on the rear surface of the plate member, even if the plurality of supporting members has an integrated structure, the supporting members may be shifted or fallen easily by application of an external force. However, according to the invention as claimed in claim 1, because the relationship between relative positions of the plurality of supporting members is substantially not changed by application of an external force, when an external force is applied to one of the supporting members by application of pressure or the like from the front surface side of the plate member, it is possible to prevent the supporting members from being shifted or fallen because the force is received by the whole of the supporting members. As the result, use of screw or adhesive is not required.

Therefore, it is possible to provide a burn-in board which has a flexure prevention structure for preventing the plate member from flexing surely, which can be easily mounted to and demounted from the plate member without use of screw nor adhesive.

Although the method for integrating the plurality of supporting members is not limited, for example, a method in which each of them is connected to each other by using a connecting member having little flexibility, and the like.

The present invention does not exclude use of screw or the like and therefore the minimum of screw or the like can be safely used as necessary.

Preferably, the burn-in board further comprising a connecting member for connecting the plurality of supporting members to one another integrally.

According to the burn-in board having such a structure, because the plurality of supporting members are connected to one another integrally, it is sufficient to install the whole of the plurality of supporting members on the rear surface of the plate member integrally, and a work for mounting or demounting a large number of rod-like supporting rods one by one is not required. Because the supporting members in the invention is not shifted or fallen easily even if a pressure or the like is applied to the supporting members from the front surface side of the plate member, it is necessary to use no screw nor adhesive.

Preferably, the connecting member is rod-like. According to the burn-in board having such a connecting member, it is possible to connect the plurality of supporting members easily because the connecting member is rod-like.

For example, the supporting members can be connected to one another by forming a through hole through which the connecting member can penetrate, in the supporting members and by making the connecting member penetrate through the hole.

In this case, it is preferable that each of the through holes formed in the supporting members has approximately the same shape and size as the section perpendicular to the longitudinal direction, of the rod-like connecting member. Such a structure can prevent the connecting member penetrating through the supporting members from easy sliding in or slipping out of the through holes formed in the supporting members. As the result, relative positions of the supporting members come to be substantially not changed easily.

The through holes formed in the supporting members may have a size enough for the connecting member to pass easily therethrough. In this case, it is possible to prevent the connecting member from easy sliding in or slipping out of the through holes formed in the supporting members, by connecting the connecting member and the supporting members penetrated by the connecting member, by using another connecting member such as an L-shaped angle member. As the result, relative positions of the supporting members come to be substantially not changed easily.

The supporting members can be connected to one another by attaching square rods as the connecting member to both end surfaces of whole supporting members by screwing or the like.

In any case, the relationship between relative positions of the plurality of supporting members is substantially not changed even when an external force is applied thereto.

Preferably, each of the plurality of supporting members has a through hole having approximately the same figure and size, formed at a position which is a perpendicular intersection of a side surface of the supporting member with the rod-like connecting member extending in a longitudinal direction, so that the plurality of supporting members are connected to one another integrally by fitting the connecting member into the through holes of the supporting members.

In such a burn-in board, a through hole through which the rod-like connecting member can penetrate, is formed in each of the supporting members. The supporting members can be connected to one another by making the connecting member penetrate through the through holes.

Concretely, a connecting member is put into a through hole of each of the supporting members to connect the supporting members with one another in a spit state. The whole of the flexure prevention structure can be constructed by a plurality of supporting members and a plurality of connecting members, which are connected crosswise to each other in a state of lattice, as needed, by forming a plurality of through holes in each of the supporting members and by making a plurality of connecting members penetrate through the through holes in a spit state.

It is preferable that each of the through holes formed in the supporting members has approximately the same shape and size as the section perpendicular to the longitudinal direction, of the connecting member. In such a structure, once the connecting member is put into the through holes of the supporting members, the connecting member cannot be easily slided in or slipped out of the through holes formed in the supporting members. As the result, the relationship between relative positions of the plurality of supporting members is not easily changed even when an external force is applied thereto.

Preferably, the burn-in board of the invention further comprises a reinforcing frame forming a rectangular frame body which is constructed by rectangular bars and is fixed to the rear surface of the plate member in the vicinity of the edges thereof, wherein the flexure prevention structure is loaded on the rear surface of the plate member in the reinforcing frame, without use of screw nor adhesive.

The burn-in board may further comprise a protective cover having a shape of rectangular flat plate, which is attached on a rear surface of the reinforcing frame to cover the entirety of the rear surface of the supporting members.

BRIEF DESCRIPTION OF THE DRAWINGS

The present invention will become more fully understood from the detailed description given hereinbelow and the accompanying drawings which are given by way of illustration only, and thus are not intended as a definition of the limits of the present invention, and wherein.

PREFERRED EMBODIMENT OF THE INVENTION

An embodiment of the burn-in board having a flexure prevention structure, according to the present invention will be explained with reference to FIGS. 1 to 3, as follows.

Figure 1A:
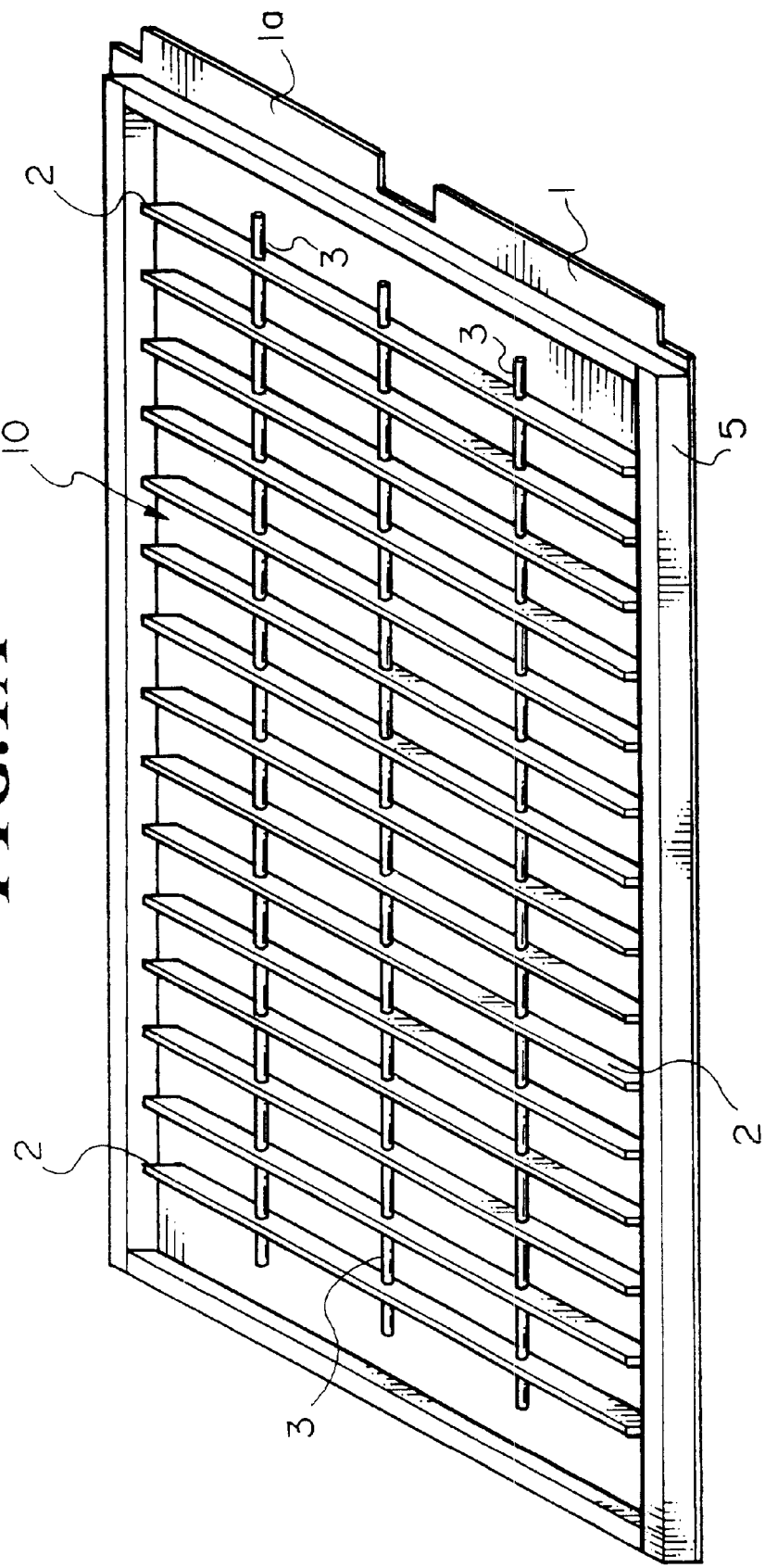
FIG. 1A is a perspective view of an embodiment of the burn-in board with a flexure prevention structure, according to the present invention.
Figure 1B:
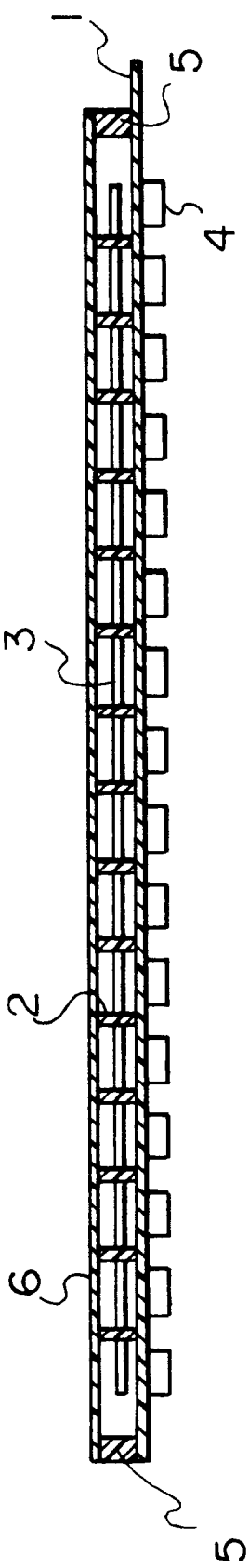
FIG. 1B is a vertical sectional view of the burn-in board.
Figure 2:
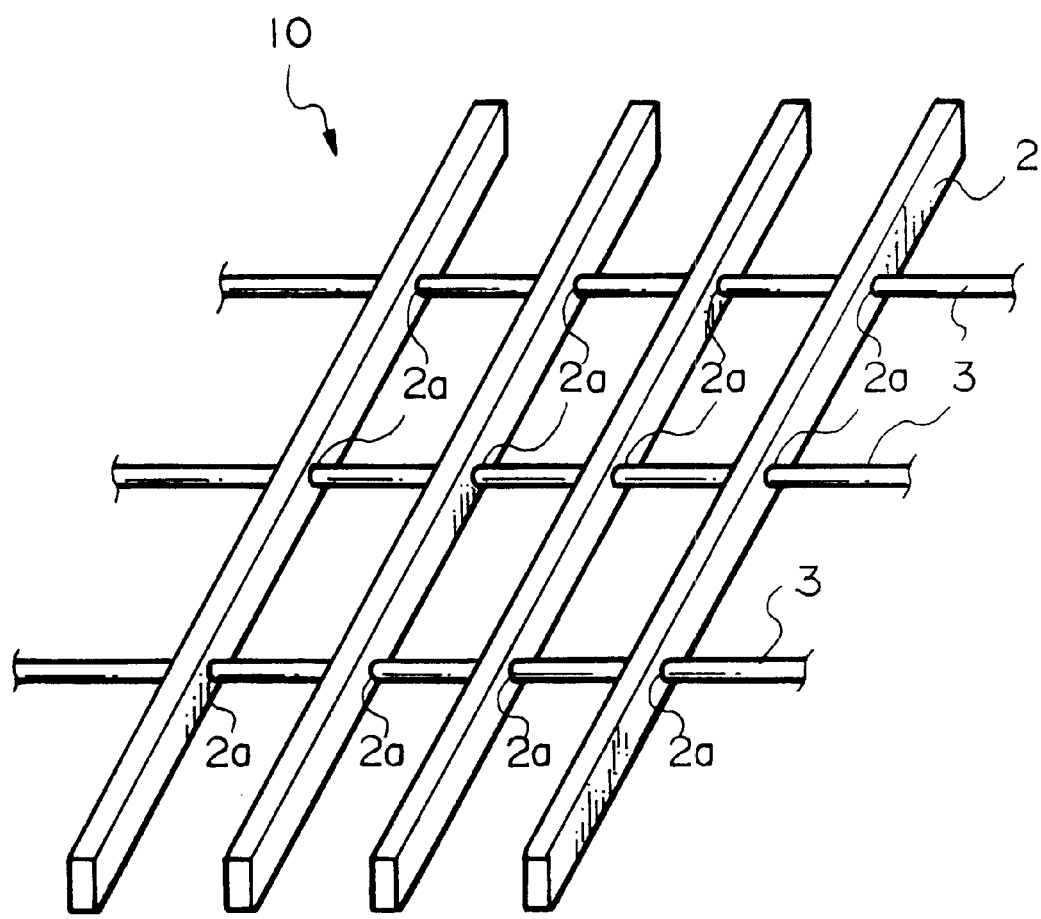
FIG. 2 is a perspective view showing a portion of a flexure prevention structure provided in the burn-in board in FIG. 1.

FIG. 1A shows the rear side of the burn-in board provided with a flexure prevention structure, and FIG. 1B shows a state of the burn-in board shown in FIG. 1A which has a protective cover 6 attached to the rear side thereof.

The burn-in board 1 has a flat plate 1a having approximately a rectangular shape. On the front surface of the burn-in board, a circuit pattern which is not shown in the figure is formed. IC sockets 4, 4, . . . are soldered to predetermined positions of the circuit pattern.

On the rear surface of the burn-in board 1, a reinforcing frame 5 forming a rectangular frame body which is constructed by rectangular bars is fixed in the vicinity of the edges of the rear surface.

The burn-in board 1 is provided with a flexure prevention structure 10 on the inner side of the reinforcing frame 5 on the rear surface thereof.

The flexure prevention structure 10 comprises the supporting members including a plurality of supporting rods 2, 2, . . . and the connecting member including a plurality of connecting rods 3, 3 and 3.

Each of the supporting rods 2, 2, . . . is a square rod having approximately the same height as the reinforcing frame 5 and having a longitudinal length to be in place inside the width (shorter side) of the reinforcing frame 5 in FIG. 1A. In the side surface of eachof the supporting rods 2, 2, . . . , circular through holes 2a, 2a, are formed, as shown in FIG. 2. Each of the circular through holes 2a, 2a, . . . has approximately the same figure and size as the vertical section perpendicular to the longitudinal direction of a circular rod-like connecting rod 3.

Each of the connecting rods 3, 3 and 3 can penetrate through the circular through holes 2a, 2a, . . . and has a longitudinal length to be in place inside the length (longer side) of the reinforcing frame 5 in FIG. 1A.

Before the flexure prevention structure 10 is installed on the burn-in board 1, the connecting rods 3, 3 and 3 are put into the circular through holes 2a, 2a, . . . of the supporting rods 2, 2, . . . , so that the supporting rods 2, 2, . . . are spitted with the connecting rods 3, 3 and 3. Thus, the supporting rods 2, 2, . . . are connected with one another through the connecting rods 3, 3 and 3 to make all of the supporting rods a body.

Because each of the circular through holes 2a, 2a, . . . of the supporting rods 2, 2, . . . has approximately the same shape and size as the section perpendicular to the longitudinal direction, of the connecting rods 3, 3 and 3, once each of the connecting rods 3, 3 and 3 is put into the circular through holes 2a, 2a, . . . , the connecting rods 3, 3 and 3 cannot be easily slided in or slipped out of the circular through holes 2a, 2a, . . . . That is, the supporting rods 2, 2, . . . are hard to move to the connecting rods 3, 3 and 3, and therefore the flexure prevention structure 10 has a high rigidity as a whole.

As the result, when an external force is applied to one of the supporting rods 2 in the flexure prevention structure, it is possible to prevent the supporting rod 2 from being shifted or fallen because the force is received by the whole of the flexure prevention structure 10.

Thereafter, the whole of the flexure prevention structure 10 which comprises the supporting rods 2, 2, . . . and the connecting rods 3, 3 and 3, which are made a body, is placed on the rear surface of the flat plate 1a, as shown in FIG. 1A.

On the placed flexure prevention structure 10, a protective cover 6 which is a rectangular flat plate is further covered, and is attached to the reinforcing frame 5 to fix.

Because the supporting rods 2, 2, have approximately the same height as the reinforcing frame 5, the supporting rods 2, 2, . . . exist between the flat plate 1a and the protective cover 6 and support the flat plate 1a while being into contact with both the flat plate 1a and the protective cover 6.

The step for fitting IC packages on the burn-in board 1 having the above-described flexure prevention structure 10 will be explained with reference to FIG. 3.

The burn-in board 1 provided with the flexure prevention structure 10 and the protective cover 6 is placed on a working bench 8 in a state of the IC sockets 4, 4, . . . facing upward.

Figure 3:
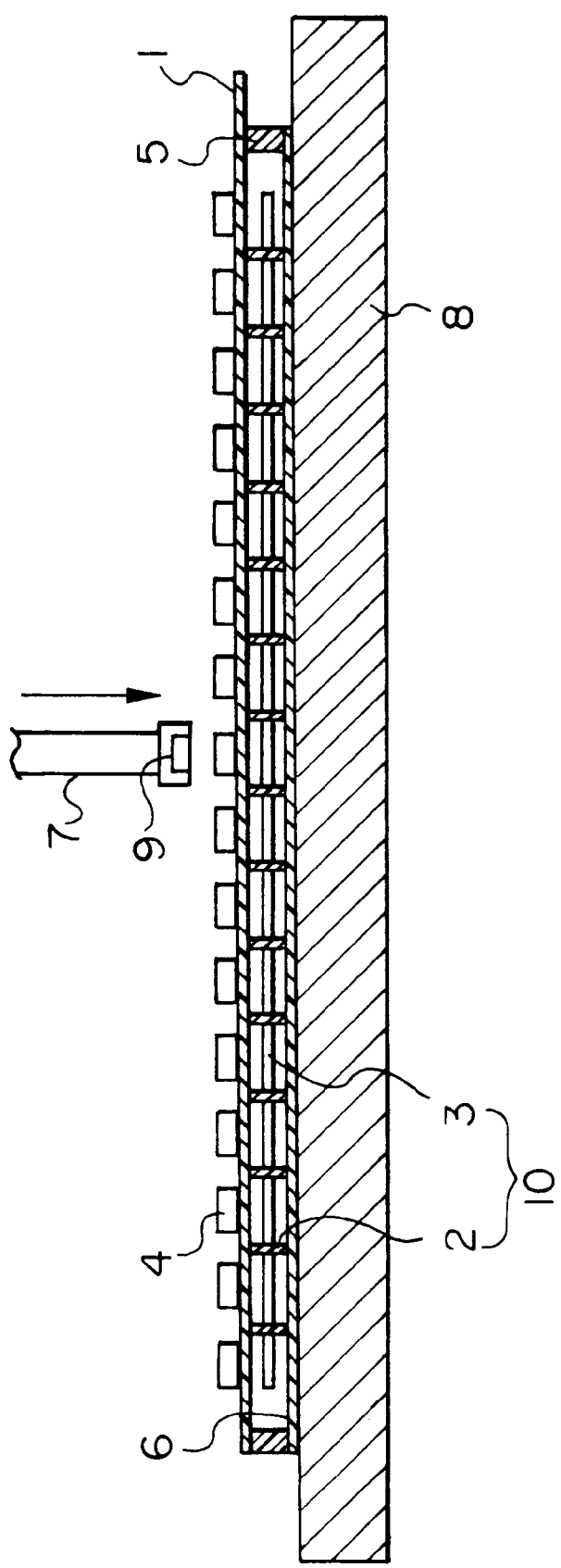
FIG. 3 is a vertical sectional view for explaining a process for attaching IC packages to the burn-in board in FIG. 1.
Figure 4A:
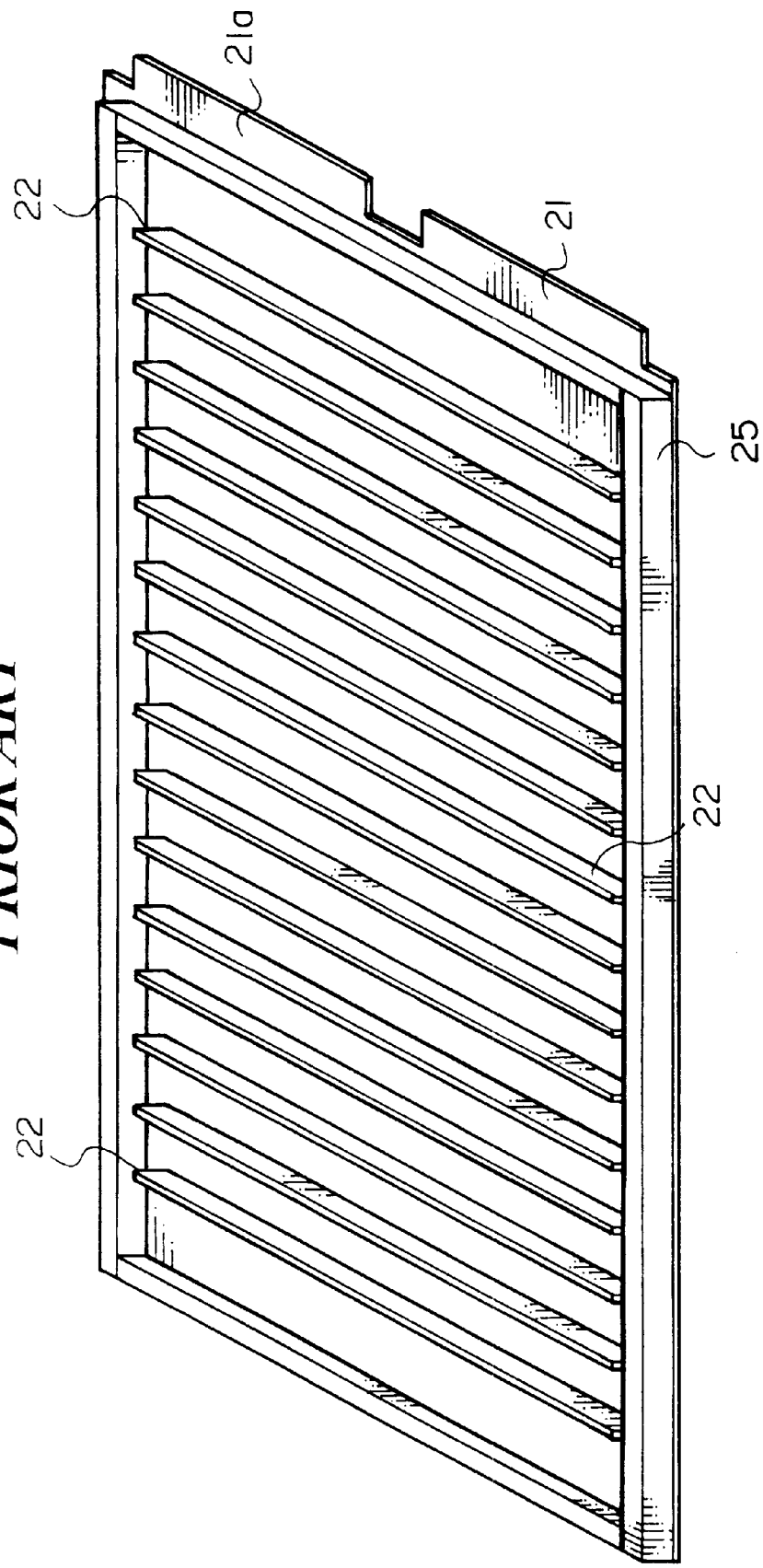
FIG. 4A is a perspective view of a conventional burn-in board with a flexure prevention structure.
Figure 4B:
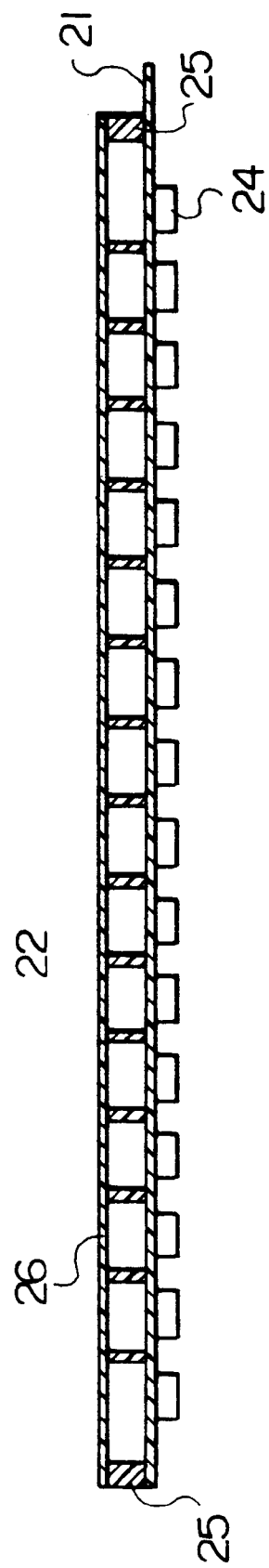
FIG. 4B is a vertical sectional view of the conventional burn-in board.

An IC package 9 is fitted on each IC socket 4 by an IC installation and removal device 7 (toward the arrow direction in FIG. 3).

During the fitting step, because the IC installation and removal device 7 makes the IC package 9 put on by applying a mechanical pressure to the IC package 9, a downward pressure is applied or vibration is transmitted, to the burn-in board 1 through the IC package 9.

However, the flat plate 1a is hard to flex because the rear side of the burn-in board 1 is supported by the supporting rods 2, 2, . . . .

According to the burn-in board 1 according to the present invention, because the burn-in board 1 comprises a flat plate 1a mainly on which IC packages 9 can be loaded, and a flexure prevention structure 10 for preventing the flat plate 1a from flexing by a plurality of rod-like supporting rods 2, 2, . . . supporting approximately the entirety of rear surface of the flat plate 1a, and the plurality of connecting rods 3, 3 and 3 for connecting the supporting rods 2, 2, . . . to unite them in a body. In the supporting rods 2, 2, . . . , circular through holes 2a, 2a, . . . are having approximately the same figure and size as the vertical section perpendicular to the longitudinal direction of the connecting rods 3, 3 and 3. Therefore, once the connecting rods 3, 3 and 3 are put into the circular through holes 2a, 2a, . . . , the supporting rods 2, 2, . . . are connected to one another so that the relationship between relative positions of the plurality of supporting rods 2, 2, . . . is substantially not changed by application of an external force.

Such a burn-in board 1 does not require a work for mounting or demounting a large number of used supporting rods 2, 2, . . . one by one, and does require only a work for installing the supporting rods 2, 2, . . . as a body on the rear surface of the flat plate 1a. Therefore, it is possible to improve workability for manufacturing the burn-in board.

During an IC package 9 is fitted on the IC socket 4, a pressure or the like is applied to the burn-in board 1 from the front surface side of the flat plate 1a so that an external force is given to one of the supporting rods 2. However, because the force is received by the whole of the flexure prevention structure 10, it enables prevention the supporting rod 2, 2, from being shifted or fallen easily and does not require use of screw nor adhesive.

Because use of screw is not required, design for patterning circuits to be formed on the front surface of the flat plate 1a is not restricted.

As described above, according to the invention, it is possible to provide a burn-in board 1 having a flexure prevention structure 10 for preventing the plate member 1a from flexing surely, which can be easily mounted to and demounted from the flat plate 1a, without screw nor adhesive.

In the above-described embodiment, although the number of the connecting rods 3, 3 and 3 is 3, this is not necessarily. It may be a number enough for the supporting rod 2, 2, . . . not to be shifted nor fallen, so as not to make the plate 1a flex, by a pressure or the like caused while the IC package 9 is fitted by using the IC installation and removal device 7.

Each of the connecting rods 3, 3 and 3 may be a square rod, not a circular rod. In case of square rod, a through hole having a rectangular shape which corresponds to the vertical sectional shape of the connecting rod is formed, in place of a circular through hole 2a. Each connecting rod which is square one and each supporting rod may be screwed by using an L-shaped angle member or the like, so that all supporting rods are connected to be a body.

Penetration of the supporting rods by the connecting rods are not essential for connection therebetween. For example, each side of ends of all supporting rods can be connected with a connecting rod by screwing or the like, to form a flexure prevention structure.

According to the burn-in board of the present invention, it does not require a work for mounting or demounting a large number of rod-like supporting rods one by one, and does require only a work for installation of the whole supporting members on the rear surface of the plate member as a body.

When a pressure or the like is applied from the front surface side of the plate member, it is possible to prevent the supporting members from being shifted or fallen.

Therefore, it is possible to provide a burn-in board which has a flexure prevention structure for preventing the plate member from flexing surely, which can be easily mounted to and demounted from the plate member without use of screw nor adhesive.

According to the burn-in board further comprising a connecting member for connecting the plurality of supporting members to one another integrally, because the plurality of supporting members are connected to one another by a connecting member, it is possible to provide a burn-in board which has a flexure prevention structure for preventing the plate member from flexing surely, which can be easily mounted to and demounted from the plate member without use of screw nor adhesive.

According to the burn-in board having a rod-like connecting member, it is possible to connect the plurality of supporting members easily because the connecting member has a rod-shape.

According to the burn-in board in which the supporting members can be connected to one another by making the connecting member penetrate through the through holes formed in the supporting members, it is possible to provide a burn-in board which has a flexure prevention structure for preventing the plate member from flexing surely, which can be easily mounted to and demounted from the plate member without use of screw nor adhesive.

What is claimed is:

1. A burn-in board comprising:
    a plate member for loading a plurality of electronic devices to be tested thereon: and
    a flexure prevention structure for preventing the plate member from flexing, which comprises a plurality of supporting members for supporting substantially the entire rear surface of the plate member, the supporting members having an integrated structure so that a relationship among relative positions of the plurality of supporting members is substantially not changed by application of an ordinary external force, the flexure prevention structure including a rod-like connecting member for connecting the plurality of supporting members to one another integrally each of the plurality of supporting members having a through hole having approximately the same shape and size, formed at a position which is a perpendicular intersection of a side surface of the supporting member with the rod-like connecting member extending in a longitudinal direction, so that the plurality of supporting members are connected to one another integrally by fitting the connecting member into the through holes of the supporting members.

2. A burn-in board as claimed in claim 1, further comprising a reinforcing frame forming a rectangular frame body which is constructed by rectangular bars and is fixed to the rear surface of the plate member in the vicinity of the edges thereof, wherein the flexure prevention structure is installed on the rear surface of the plate member within an inner side of the reinforcing frame.

3. A burn-in board as claimed in claim 2, further comprising a protective cover having a shape of a rectangular flat plate, which is attached on a rear surface of the reinforcing frame to cover the entirety of a rear surface of the supporting members.

4. A burn-in board comprising:
    a plate member for loading a plurality of electronic devices to be tested thereon,
    a flexure prevention structure for preventing the plate member from flexing, which comprises a plurality of supporting members for supporting substantially the entire rear surface of the plate member, the supporting members having an integrated structure so that a relationship among relative positions of the plurality of supporting members is substantially not changed by application of an ordinary external force, and
    a reinforcing frame forming a rectangular frame body which is constructed by rectangular bars and is fixed to the rear surface of the plate member in the vicinity of the edges thereof,
    wherein the flexure prevention structure is installed on the rear surface of the plate member within an inner side of the reinforcing frame, without use of screw nor adhesive.

5. A burn-in board as claimed in claim 4, further comprising a protective cover having a shape of rectangular flat plate, which is attached on a rear surface of the reinforcing frame to cover the entirety of the rear surface of the supporting members.

6. A burn-in board comprising:
    a plate member for loading a plurality of semiconductor devices to be tested thereon;
    a rectangular shaped reinforcing frame constructed by four rectangular bars which are mounted to the rear surface of the plate member and extend along edges thereof;
    a flexure prevention structure for preventing the plate member from flexing, which is loaded on the rear surface of the plate member in the reinforcing frame, without use of screw nor adhesive, and which comprises a plurality of rod-like supporting members for supporting approximately the entirety of rear surface of the plate member and a connecting member for connecting the plurality of supporting members to one another, the supporting members having an integrated structure so that a relationship between relative positions of the plurality of supporting members is substantially not changed by application of an ordinary external force; and
    a protective cover having a shape of rectangular flat plate, which is attached on a rear surface of the reinforcing frame to cover the entirety of the rear surface of the flexure prevention structure.

7. A burn-in board as claimed in claim 6, wherein each of the plurality of supporting members has a through hole having approximately the same figure and size, formed at a position which is a perpendicular intersection of a side surface of the supporting member with the rod-like connecting member extending in a longitudinal direction, so that the plurality of supporting members are connected to one another integrally by fitting the connecting member into the through holes of the supporting members.

* * * * *